United States Patent
Shi

(10) Patent No.: US 7,972,881 B2
(45) Date of Patent: Jul. 5, 2011

(54) METHOD FOR COOLING LIGHT-EMITTING DIODE

(75) Inventor: Wei Shi, San Jose, CA (US)

(73) Assignee: Bridgelux, Inc., Livermore, CA (US)

(*) Notice: Subject to any disclaimer, the term of this patent is extended or adjusted under 35 U.S.C. 154(b) by 0 days.

(21) Appl. No.: 12/700,556

(22) Filed: Feb. 4, 2010

(65) Prior Publication Data

US 2010/0213486 A1 Aug. 26, 2010

Related U.S. Application Data

(62) Division of application No. 12/393,491, filed on Feb. 26, 2009, now Pat. No. 7,851,819.

(51) Int. Cl.
*H01L 21/00* (2006.01)

(52) U.S. Cl. ............... 438/30; 438/25; 438/29; 257/79; 257/99

(58) Field of Classification Search .............. 438/25, 438/28, 29, 30; 257/79, 98, 99, E33.661
See application file for complete search history.

(56) References Cited

U.S. PATENT DOCUMENTS

| | | | |
|---|---|---|---|
| 6,636,539 B2 | 10/2003 | Martinsen | |
| 7,514,718 B2 | 4/2009 | Shin et al. | |
| 7,618,157 B1 | 11/2009 | Galvez et al. | |
| 7,682,048 B2 | 3/2010 | Hsu et al. | |
| 2002/0176459 A1* | 11/2002 | Martinsen | 372/34 |
| 2005/0232818 A1 | 10/2005 | Sandell et al. | |
| 2008/0099777 A1* | 5/2008 | Erchak et al. | 257/99 |
| 2008/0175008 A1 | 7/2008 | Hu et al. | |

* cited by examiner

*Primary Examiner* — Phuc T Dang
(74) *Attorney, Agent, or Firm* — Albert Harnois

(57) ABSTRACT

A heat spreader for an LED can include a thermally conductive and optically transparent member. The bottom side of the heat spreader can be configured to attach to a light emitting side of the LED. The top and/or bottom surface of the heat spreader can have a phosphor layer formed thereon. The heat spreader can be configured to conduct heat from the LED to a package. The heat spreader can be configured to conduct heat from the phosphors to the package. By facilitating the removal of heat from the LED and phosphors, more current can be used to drive the LED. The use of more current facilitates the construction of a brighter LED, which can be used in applications such as flashlights, displays, and general illumination. By facilitating the removal of heat from the phosphors, desired colors can be better provided.

5 Claims, 6 Drawing Sheets

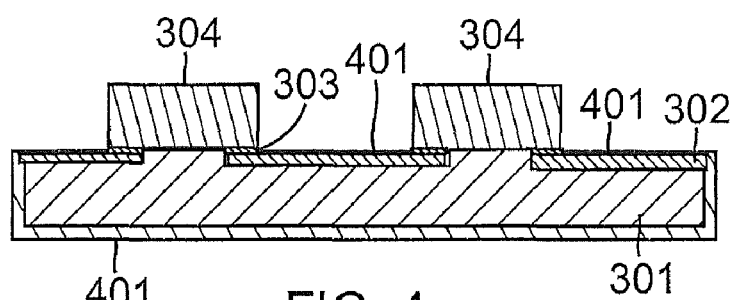
FIG. 3
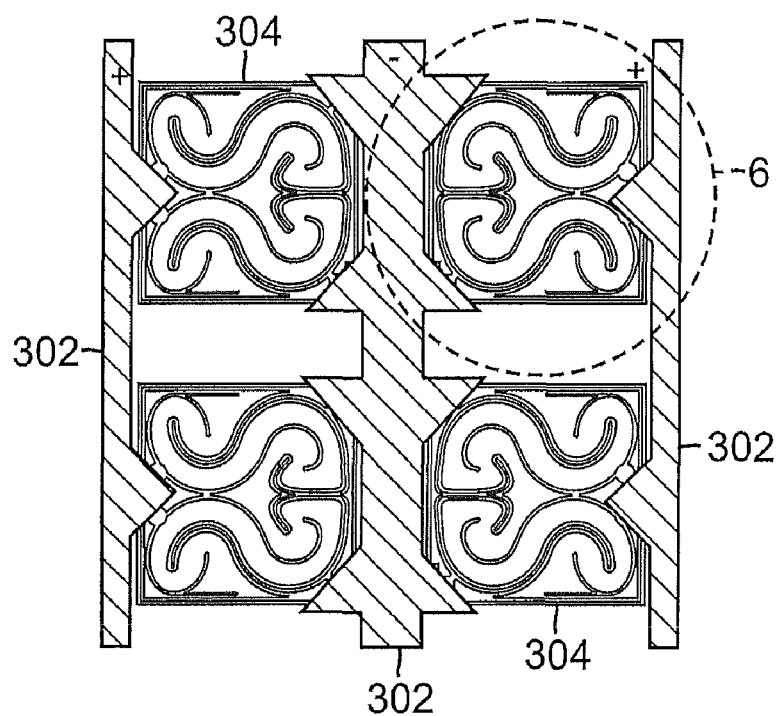
FIG. 4
FIG. 5

US 7,972,881 B2

METHOD FOR COOLING LIGHT-EMITTING DIODE

RELATED APPLICATION

This patent application is a divisional application of a patent application Ser. No. 12/393,491, filed Feb. 26, 2009 and entitled TRANSPARENT HEAT SPREADER FOR LEDS, the entire content of which is hereby incorporated explicitly by reference.

TECHNICAL FIELD

The present invention relates generally to light emitting diodes (LEDs). The present invention relates more particularly to a heat sink base for enhancing the optical performance of a LED by reducing the temperature of a junction of the LED and/or by reducing the temperature of one or more phosphors of the LED.

BACKGROUND

Light emitting diodes (LEDs) are well known. LEDs are commonly used as indicators on electronic devices. For example, the red or green power indicator on many consumer electronic devices, such as CD and DVD players, is often an LED.

There is a desire to use LEDs in applications such as flashlights, displays, and general illumination. Brighter LEDs are generally required in such applications. However, brighter LEDs require more current and more current results in the production of more heat. Heat reduces the efficiency of LEDs.

Thus, although contemporary LEDs have proven generally suitable for some purposes, they possess inherent deficiencies that detract from their overall effectiveness and desirability. Therefore, it is desirable to provide LEDs that can more efficiently use higher current, such as by better managing the heat produced thereby.

BRIEF SUMMARY

Methods and systems for providing enhanced heat dissipation from light emitting diodes (LEDs) are disclosed herein. For example, a heat spreader for an LED can comprise a thermally conductive and optically transparent member though which light from the LED passes and which can be configured to facilitate heat flow away from the LED.

In accordance with an example of an embodiment, an LED assembly can comprise at least one LED die, a package to which the LED die/dice are attached, and a heat spreader comprising a thermally conductive and optically transparent member though which light from the LED die/dice passes and which can be configured to facilitate heat flow away from the LED die/dice.

In accordance with an example of an embodiment, a method for cooling an LED can comprise conducting heat away from an LED die to a package though a thermally conductive and optically transparent member.

In accordance with an example of an embodiment, an LED assembly can comprise an LED die, a package configured to at least partially contain the LED die, and means for facilitating heat flow from the LED die to the package and for facilitating the transmission of light from the LED die therethrough (through the means for facilitating heat flow).

In accordance with an example of an embodiment, an LED assembly can comprise an LED die; a package configured to at least partially contain the LED die; a phosphor configured to absorb a color of light from the LED die and to emit a different color; and means for facilitating heat flow from the phosphor to a package and for facilitating the transmission of light from the LED die therethrough.

In accordance with an example of an embodiment, a LED assembly can comprise a substrate; at least one LED die attached to the substrate; a standoff attached to the substrate; and a thermally conductive and optically transparent member attached to the standoff such that light from the LED(s) passes through the thermally conductive and optically transparent member. Heat from the LED(s) flows from the thermally conductive and optically transparent member, through the standoff, and to the substrate.

In accordance with an example of an embodiment, a method for facilitating heat flow from an LED can comprise facilitating heat flow through a substantially transparent member to a substrate of the LED.

In accordance with an example of an embodiment, a method for making an LED can comprise plating electrical connection patterns upon a thermally conductive and optically transparent member; plating solder upon the electrical connection patterns; solder bonding electrodes of an LED die to the thermally conductive and optically transparent member via the plated solder; and attaching the thermally conductive and optically transparent member to a substrate such that the LED is disposed therebetween.

The heat spreader can be configured to conduct heat from the LED junction and the phosphors to the package. By facilitating the removal of heat from the LED, more current can be used to drive the LED. The use of more current facilitates the construction of a brighter LED that can be used in applications such as flashlights, displays, and general illumination. By facilitating the removal of heat from the phosphors, desired colors can be better provided.

This invention will be more fully understood in conjunction with the following detailed description taken together with the following drawings.

BRIEF DESCRIPTION OF THE DRAWINGS

FIG. 3 is a semi-schematic cross-sectional side view of an inverted (upside down, such as prior to being flipped) transparent heat spreader having connectors and solder formed thereon, according to an example of an embodiment;

FIG. 4 is a semi-schematic cross-sectional side view of an inverted (upside down, such as prior to being flipped) transparent heat spreader showing two LED dice attached thereto, according to an example of an embodiment;

FIG. 5 is a semi-schematic bottom view through a transparent heat spreader showing four LED dice attached thereto, according to an example of an embodiment;

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
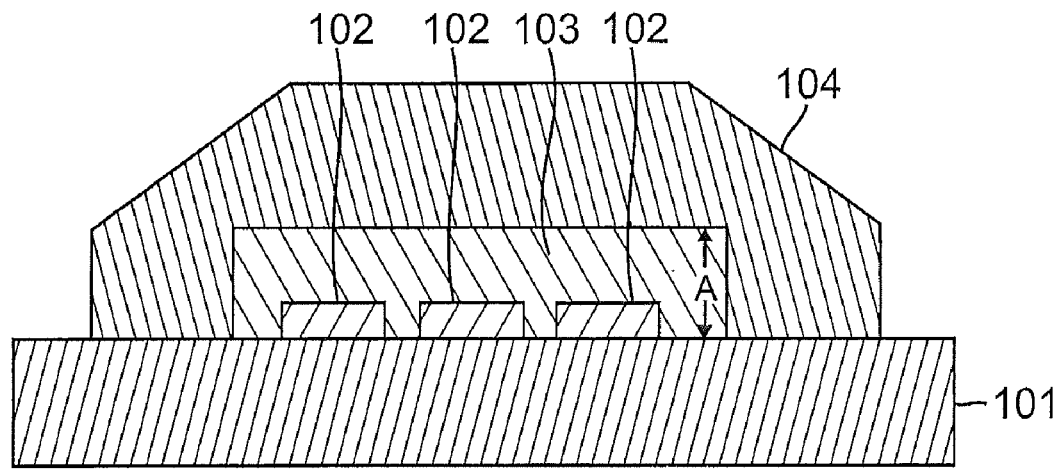
FIG. 1 is a semi-schematic cross-sectional side view of a light emitting diode (LED) assembly, according to contemporary practice.

As discussed above, the heat produced by current flow through a light emitting diode (LED) must be accommodated, so as to facilitate the use of the higher currents that are required in order to provide brighter LEDs. The temperature $T_j$ of the junction or active area of an LED must typically be kept below approximately 150° C. in order for the LED to produce light efficiently.

The temperature of any phosphors that are used to modify the color of light for the LED must be as low as possible, so provide desired color conversion efficiency. As those skilled in the art will appreciate, the Stokes shift tends to cause the phosphors of an LED assembly to undesirably heat up. The Stokes shift is the difference in the energy levels between the absorption spectra and the emission spectra of a fluorescent material. Since more energy is absorbed as visible light than is emitted as visible light, the difference in energy becomes heat.

As the color conversion efficiency of an LED drops, the color of the light produced thereby changes. Thus, it is necessary to maintain the color conversion intensity so as to reliably provide the desired color of light.

Methods and systems for enhancing the optical performance of a LED by reducing the temperature $T_j$ of a junction of the LED and/or by reducing the temperature of one or more phosphors of the LED are disclosed.

A heat spreader for an LED can include a thermally conductive and optically transparent substrate. The bottom side of the heat spreader can be configured to attach to a light emitting side of the LED. The top side of the heat spreader can have a phosphor layer formed thereon. The heat spreader can be configured to conduct heat from the LED to a package. The heat spreader can be configured to conduct heat from the phosphors to the package. By facilitating the removal of heat from the LED and phosphors, more current can be used to drive the LED. The use of more current facilitates the construction of a brighter LED, which can be used in applications such as flashlights, displays, and general illumination.

In accordance with an example of an embodiment, a heat spreader for an LED can comprise a thermally conductive and optically transparent member though which light from an LED passes and which is configured to facilitate heat flow away from the LED. The thermally conductive and optically transparent member can have a thermal conductivity higher than approximately 5 W/mK. For example, the thermally conductive and optically transparent member can have a thermal conductivity of approximately 35 W/mK. The thermally conductive and optically transparent member can comprise sapphire, for example.

The thermally conductive and optically transparent member can be configured so as to define at least one lens. The thermally conductive and optically transparent member can be configured so as to define a global lens for a plurality of LED dice. The thermally conductive and optically transparent member can be configured so as to define a plurality of individual lenses, such as wherein each individual lens is dedicated for use by one LED die.

The bottom side of the thermally conductive and optically transparent member can be configured to attach to a light emitting side of the LED die. The LED die can be attached to the thermally conductive and optically transparent member when the thermally conductive and optically transparent member is upside down and the thermally conductive and optically transparent member can subsequently be flipped over.

The top side and/or the bottom side of the thermally conductive and optically transparent member can have a phosphor layer formed thereon. One or more phosphors can be formed upon any desired surface of the thermally conductive and optically transparent member.

The thermally conductive and optically transparent member can be configured to conduct heat from the LED to a package substrate. The thermally conductive and optically transparent member can be configured to conduct heat from the phosphors to a package substrate. The substrate can be configured to enhance a temperature uniformity of phosphors.

In accordance with an example of an embodiment, an LED assembly can comprise at least one LED die, a package to which the LED die/dice are attached, and a heat spreader comprising a thermally conductive and optically transparent member though which light from an LED die/dice passes and which is configured to facilitate heat flow away from the LED die/dice. The LED die/dice can be attached to the bottom side of the heat spreader. The heat spreader can be configured to conduct heat from the LED die/dice to the package.

A phosphor layer can be formed upon the heat spreader. The phosphor layer can be formed upon the heat spreader and the heat spreader can be configured to conduct heat from the phosphors to a package so as to enhance a temperature uniformity of phosphors.

In accordance with an example of an embodiment, a method can comprise conducting heat away from an LED die to a package though a thermally conductive and optically transparent member.

In accordance with an example of an embodiment, a LED assembly can comprise an LED die, a package configured to at least partially contain the LED die, and means for facilitating heat flow from the LED die to the package and for facilitating the transmission of light from the LED die therethrough.

In accordance with an example of an embodiment, an LED assembly can comprise an LED die, a package configured to at least partially contain the LED die, a phosphor configured to absorb a color of light from the LED die and to emit a different color, and means for facilitating heat flow from the phosphor to a package and for facilitating the transmission of light from the LED die therethrough.

In accordance with an example of an embodiment, an LED assembly can comprise a substrate; at least one LED die attached to the substrate; a standoff attached to the substrate;

and a thermally conductive and optically transparent member attached to the standoff such that light from the LED(s) passes through the thermally conductive and optically transparent member. Heat from the LED(s) can flow from the thermally conductive and optically transparent member, through the standoff, and to the substrate.

The thermally conductive and optically transparent member can define at least one lens. Thus, the thermally conductive and optically transparent member can define a global lens or can define a plurality of individual lens. One individual lens can be dedicated to each LED die.

In accordance with an example of an embodiment, a method can comprise facilitating heat flow through a substantially transparent member to a substrate of the LED.

In accordance with an example of an embodiment, a method for making an LED can comprise plating electrical connection patterns upon a thermally conductive and optically transparent member; plating solder upon the electrical connection patterns; solder bonding electrodes of an LED die to the thermally conductive and optically transparent member via the plated solder; and attaching the thermally conductive and optically transparent member to a substrate such that the LED is disposed therebetween.

A phosphor layer can be formed upon the thermally conductive and optically transparent conductive member. The thermally conductive and optically transparent member can define at least one lens through which light from the LED die passes.

Referring now to FIG. 1, a contemporary LED assembly comprises an aluminum substrate 101 upon which a plurality of LED dice 102 are disposed. A lens 104 focuses light from the LED dice 102. Phosphors 103 can be disposed intermediate the LED dice 102 and the lens 104. The phosphors can change the color of light emitted by the LED dice 102 according to well know principles.

A distance, Dimension A, between the substrate 101 and the lens 104 can be approximately 0.7 mm. This distance at least partially defines the size of the area within which the phosphors 103 are disposed.

Figure 2:
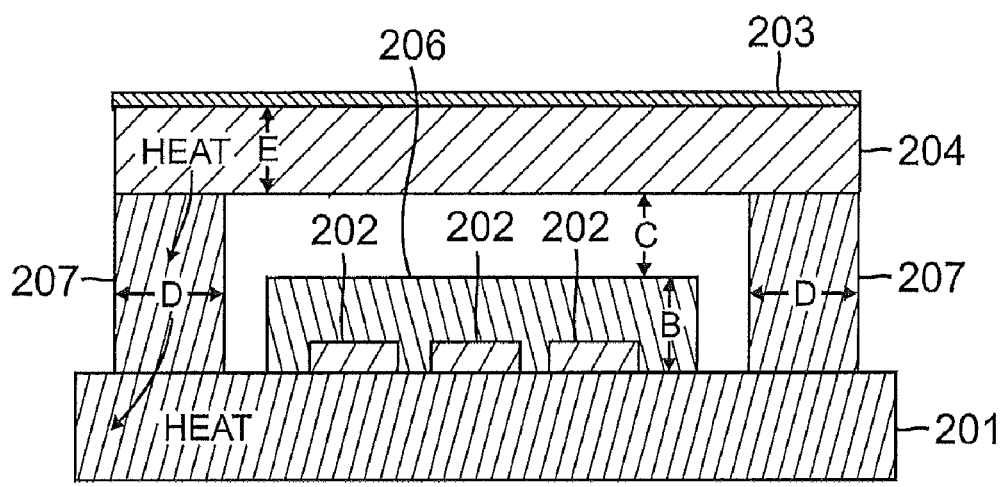
FIG. 2 is a semi-schematic cross-sectional side view of an LED assembly, according to an example of an embodiment.

Referring now to FIG. 2, an example of an embodiment is shown. An LED assembly can comprise a substrate 201 upon which a plurality of LED dice 202 are disposed. The substrate 201 can comprise an aluminum substrate. The substrate can be formed of any desired material. For example, the substrate can comprise aluminum, silicon, sapphire, Spinel, or any combination thereof.

The LED dice 202 can form an array. For example, the LED dice 202 can form a three-by-three array thereof, when view from above. The LED dice 202 can form an array of any desired size and/or configuration.

A lens 204 focuses light from the LED dice 202. Phosphor layer 203 can comprise one or more phosphors and can be formed upon the lens 204. The phosphor layer can be formed upon the upper surface of the lens 204 (as shown in FIG. 2) and/or can be formed upon the lower surface thereof. Again, the phosphors can change the color of light emitted by the LED dice 202 according to well know principles.

A transparent heat transmissive material 206 can generally cover the LED dice 202. The transparent heat transmissive material 206 can enhance the flow of heat from the LED dice 202 to the substrate 201. The transparent heat transmissive material can comprise silicone, for example.

Phosphors can be disposed within transparent heat transmissive material 207. One or more of such phosphors can be used to change the color of light emitted by LED dice 202.

A standoff 207 can be disposed intermediate the lens 204 and the substrate 201. The standoff 207 can form an annulus when viewed from above. The standoff 207 can be formed of a heat transmissive material, such as aluminum. The standoff 207 can be formed of the same material as the substrate 201.

A distance, Dimension B, between the upper surface of the substrate 101 and the upper surface of the transparent heat transmissive material can be approximately 0.7 mm. A distance, Dimension C, between the upper surface of the transparent heat transmissive material 206 and the lower surface of the lens 204 can be approximately 1.0 mm. The gap that is at least partially defined by Dimension C can contain air, nitrogen, or any other desired material. For example, the gap can comprise silicone such that substantially the entire volume intermediate the substrate 201 and the lens 204, other than the volume occupied by LED dice 202, is filled with silicone.

The standoff 207 can have a width, Dimension D, of approximately 1.5 mm for example. The lens can have a thickness, Dimension E, of approximately 0.44 mm for example.

The lens 204 can comprise a transparent heat transmissive material such as sapphire. The lens 204 defines a transparent heat spreader. The heat spreader defined by lens 204 can facilitate the flow of heat produced by LED dice 202 to substrate 201 via standoff 207. Thus, the lens 204 and the standoff 207 can cooperated to define a heat spreader. Substantially the entire area intermediate the substrate 201 and the lens 204 can be filled with a transparent heat transmissive material, such as silicone, so as to better facilitate heat flow from the LED dice 202 to the substrate 201.

The lens 204 can comprise a material having a thermal conductivity that is greater than 5 W/mK. For example, the lens 204 can comprise sapphire. Sapphire has a thermal conductivity that is approximately 35 W/mK.

Heat flow from the substrate 201 can be facilitated by mounting the substrate to a package, housing, heat sink, device, or other structure that readily facilitates heat dissipation. A heat transmissive grease, such as silicone grease, can be used to facilitate heat flow from the substrate 201 to the structure to which it is attached.

The use of such a heat spreader as that defined by lens 204 and/or standoff 207 can substantially reduce the temperature of the junction, e.g., active area, of the LED dice 202. Reducing the temperature of the junction of the LED dice allows the LED dice 202 to used more current, produce more light, and/or operate more efficiently.

The use of such a heat spreader as that defined by lens 204 and/or standoff 207 can substantially reduce the temperature of the phosphors. Reducing the temperature of the phosphors allows the phosphors to operate more efficiently. Thus, more of the light emitted by the LED dice 202 can be converted into the desired color or colors.

As shown in FIG. 2, the transparent heat spreader does not necessarily contact the LED dice (although it can). A heat spreader that does contact the LED dice is discussed below.

Referring now to FIGS. 3-12, an example of an embodiment is shown. LED dice can be attached to a transparent heat spreader. In this manner, the transparent heat spreader can generally facilitate enhanced flow of heat away from the LED dice. More particularly, as discussed with reference to FIG. 3-12 below, the LED dice can be attached to the transparent heat spreader, then the transparent heat spreader with the LED dice attached thereto, can be flipped over and bonded to a substrate.

With particular reference to FIG. 3, a heat sink base or transparent heat spreader 301 can comprise a transparent heat transmissive material, such as sapphire. Traces or conductive connectors 302 can be formed upon the transparent heat spreader 301 to facilitated current flow to LED dice attached thereto, as discussed below. The connectors can define traces upon the surface of the transparent heat spreader 301 that facilitate electrical interconnection between the LED dice 304 (FIG. 4) and a current source.

The connectors 302 can comprise an alloy of copper and nickel (Cu/Ni). The connectors 302 can comprise other conductive material such as titanium (Ti), tungsten (W), and/or tantalum (Ta). The connectors 302 can comprise any desired electrically conductive material. The connectors 302 can be approximately 2 microns to approximately 4 microns thick, for example. The connectors 302 can be approximately 100 microns to approximately 1000 microns wide, for example.

Solder 303 can be formed upon the transparent heat spreader 301, such as upon the connectors 302 thereof. The solder 303 can facilitate the attachment of LED dice 304 to the transparent heat spreader 301, as discussed below.

With particular reference to FIG. 4, one or more LED dice 304 can be attached to the transparent heat spreader 301. For example, solder 303 can be used to attach the LED dice 304 to the transparent heat spread 301. Solder can be used to attach the LED dice 304 to the transparent heat spread 301 via a reflow process, for example.

The LED dice 304 can be attached to the transparent heat spreader 301 such that the light emitting surface of the LED dice 304 faces the transparent heat spreader 301. Light from the LED dice 304 is thus directed thought the transparent heat spreader 301.

A layer of phosphor 401 can be formed upon the transparent heat spreader 301. The layer of phosphor 401 can be formed upon the top surface, the bottom surface, and or the sides of the transparent heat spreader 301. The layer of phosphor 401 can comprise one or more phosphors that change a color of light emitted from the LED dice 304 to one or more desired colors.

The layer of phosphor 401 can be formed upon the transparent heat spreader 301 prior to attachment of LED dice 304 thereto. Alternatively, the layer of phosphor 401 can be formed upon the transparent heat spreader 301 subsequent to attachment of LED dice 304 thereto.

With particular reference to FIG. 5, an example of the traces or connectors 302 is shown. Positive and negative connectors 302 can cooperate to facilitated current flow through LED dice 304.

Figure 6:
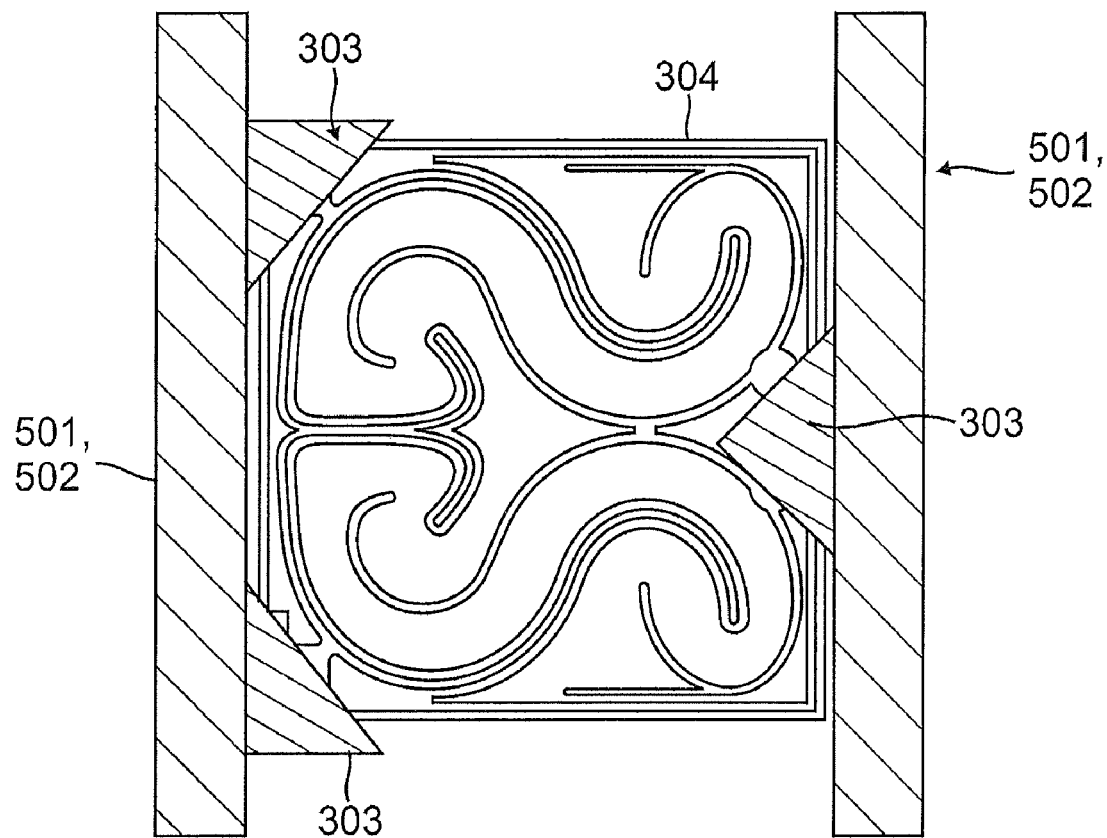
FIG. 6 is an enlargement of one of a portion of FIG. 5, such as that designated by dashed circle 6.

With particular reference to FIG. 6, solder 303 mechanically attaches LED die 304 to the transparent heat spreader 301. Solder 303 also facilitates electrical interconnection between LED die 304 and a current source.

Figure 7:
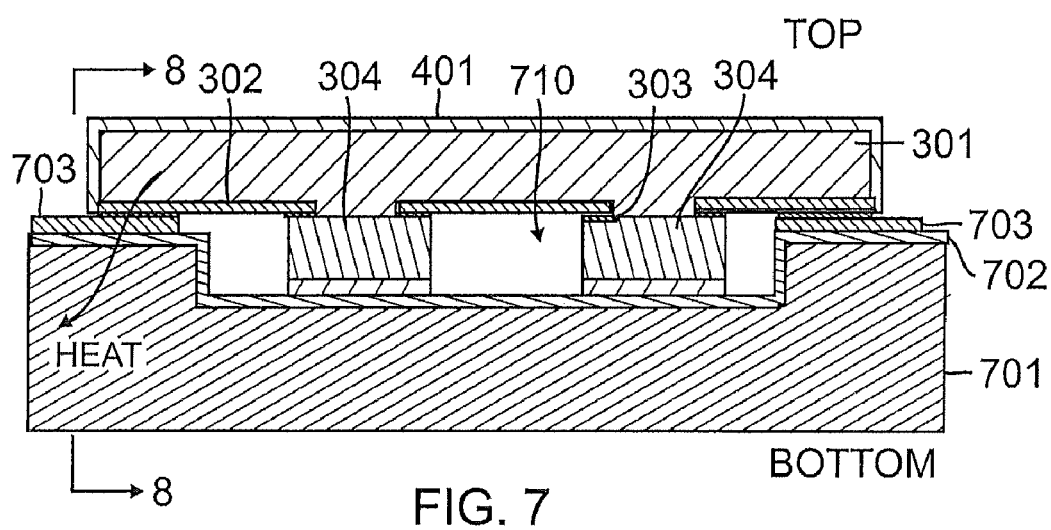
FIG. 7 is a semi-schematic cross-sectional side view of a transparent heat spreader showing two LED dice attached thereto, wherein the transparent heat spreader has been flipped over (with respect to the transparent heat spreader of FIGS. 3 and 4 such that the transparent heat spreader is now right side up) and attached to a substrate, according to an example of an embodiment.

With particular reference to FIG. 7, the transparent heat spreader 301 (and the LED dice 304) can be inverted or flipped over and attached to a substrate 701. The substrate 701 can be a package substrate, for example. That is, the substrate can be part of a package for the LED assembly. Alternatively, the substrate can be separate from the package and can either attach thereto or not attach thereto.

The substrate 701 can have a cavity 710 formed therein. One or more LED dice 304 can be received within the cavity. The cavity 710 can be sufficiently deep such that the LED dice 304 are substantially disposed within the cavity 710.

A thermal interface material (TIM) can be disposed intermediate the LED dice 304 and the substrate 701. The TIM can comprise solder paste or epoxy, for example. The TIM can facilitate heat flow from the LED dice 304 to the substrate 701.

Figure 8:
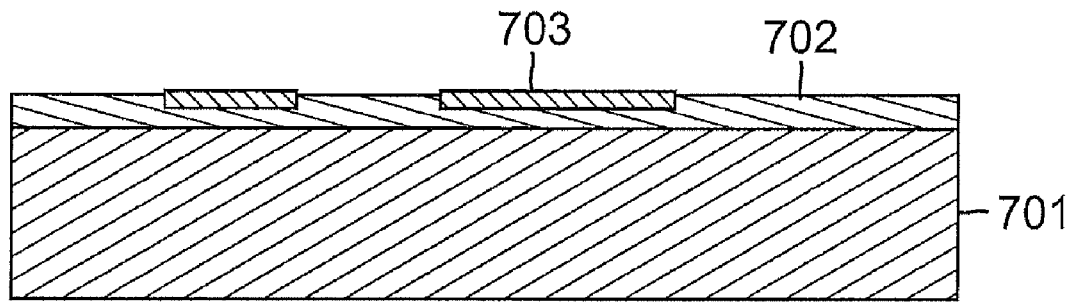
FIG. 8 is a semi-schematic cross-sectional view taken along lines 8 of FIG. 7.

With particular reference to FIG. 8, a dielectric layer 702 can be formed upon the substrate 701. Conductive traces 703 can be formed upon the dielectric layer 702. The conductive traces 703 can comprise copper (CU), for example.

Figure 9:
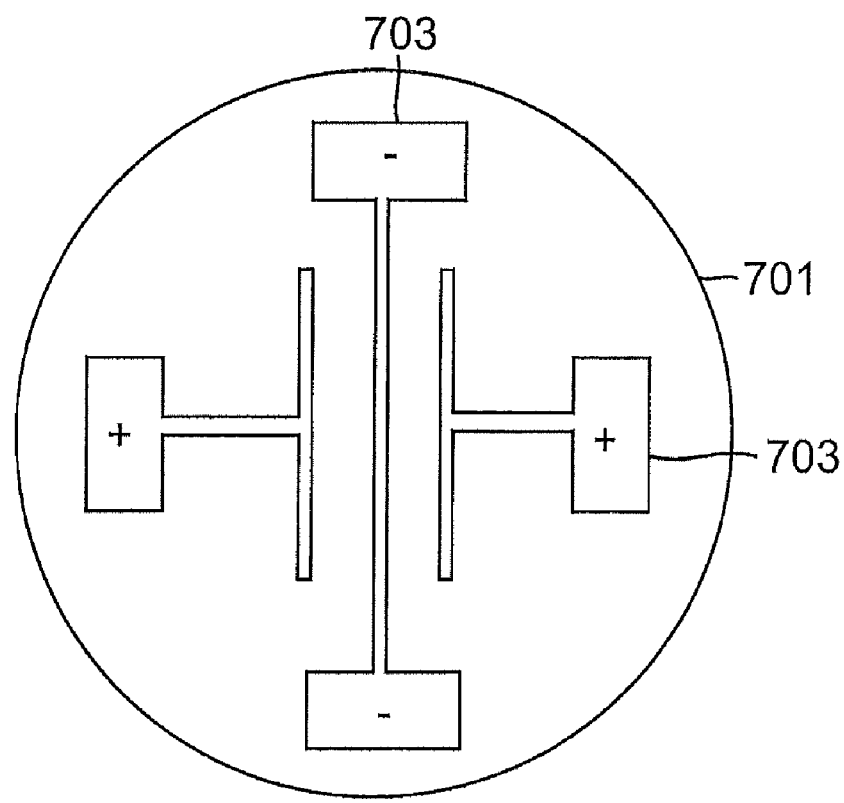
FIG. 9 is a semi-schematic top view of a thermal heat spread attached to a substrate, according to an example of an embodiment.

With particular reference to FIG. 9, an example of a pattern of conductive traces 703 is shown. Such conductive traces 703 can be formed upon the substrate 701 to facilitate current flow to the transparent heat spreader 301. Thus, the positive and negative conductive traces 703 can cooperate so as to facilitate current flow to the LED dice 304. Those skilled in the art will appreciate that various different patterns for facilitating such current flow are likewise suitable.

Figure 10:
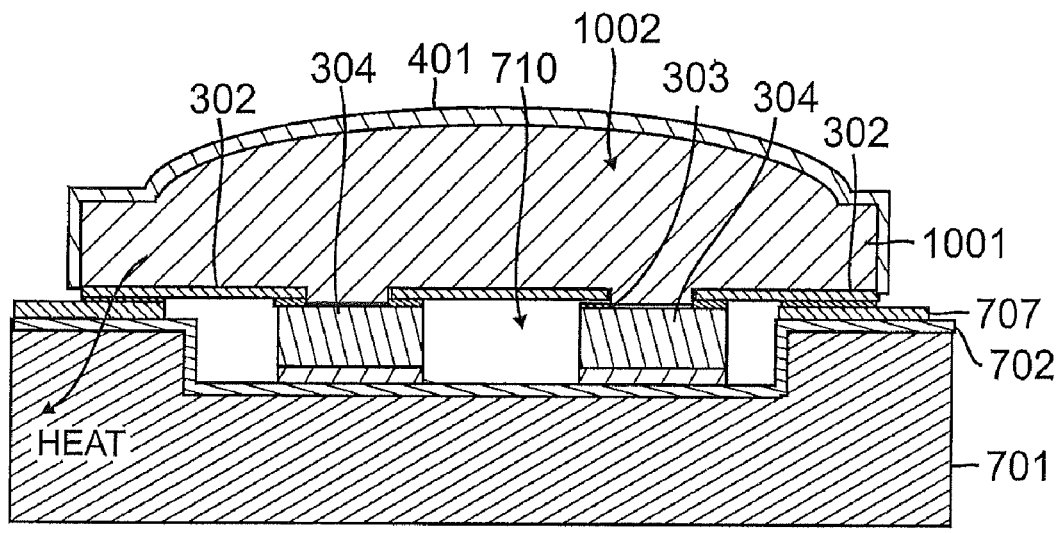
FIG. 10 is a semi-schematic cross-sectional side view of an LED assembly having a global lens, according to an example of an embodiment.
Figure 11:
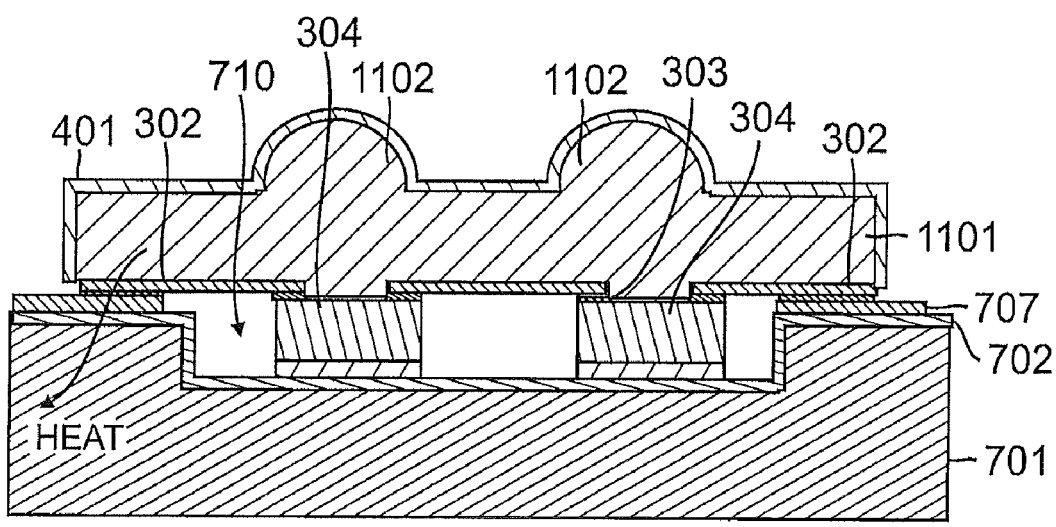
FIG. 11 is a semi-schematic cross-sectional side view of an LED assembly having a plurality of local lenses, according to an example of an embodiment.
Figure 12:
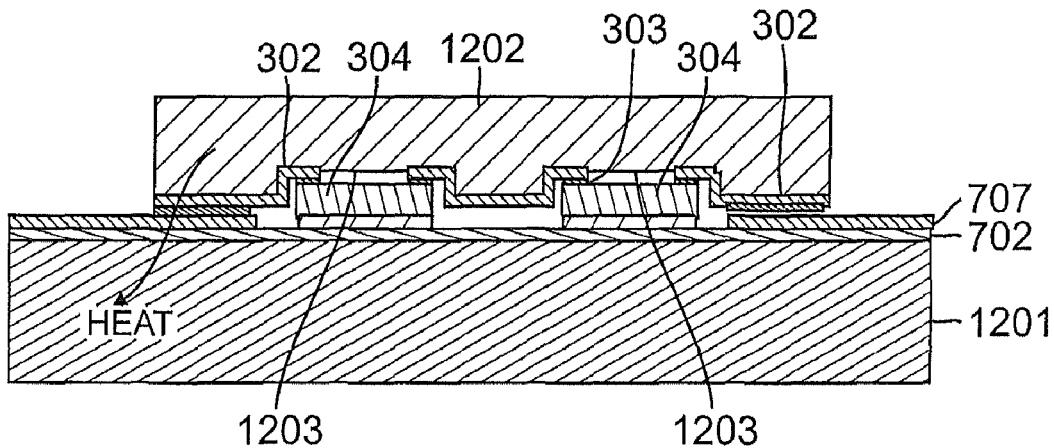
FIG. 12 is a semi-schematic cross-sectional side view of an LED assembly having one or more cavities formed in the thermal heat spreader and having a substantially flat substrate, according to an example of an embodiment.

FIGS. 10-12 show three alternative configurations with respect to the configuration shown in FIG. 7. FIGS. 10 and 11 shown alternative configurations of the transparent heat spreader wherein one or more lenses are defined thereby. FIG. 12 shows an alternative configuration of the transparent heat spreader and the substrate wherein a substantially flat substrate is used.

With particular reference to FIG. 10, the transparent heat spreader 1001 can be configured so as to define a single or global lens. Such a global lens can effect focusing of all of the LED dice 304 of the LED assembly. Phosphor layer 401 can be formed on the top, bottom, and/or sides of the transparent heat spreader 1001.

With particular reference to FIG. 11, the transparent heat spreader 1101 can be configured so as to define a plurality of individual lenses 1102. Each LED die 304 can have a dedicated lens that effects focusing thereof. Each individual lens 1102 can focus one or a plurality of LED die 304. Phosphor layer 401 can be formed on the top, bottom, and/or sides of the transparent heat spreader 1001.

With particular reference to FIG. 12, a substantially flat substrate 1201 can be used instead of a substrate having a cavity formed therein (such as the cavity 710 of substrate 701 of FIGS. 7, 10, and 11). Rather than forming a single larger cavity in the substrate 1201, a plurality of smaller cavities 1203 can be formed in the transparent heat spreader 1202. The smaller cavities 1203 can at least partially receive the LED dice 304.

A global lens (such as that of FIG. 10) or a plurality of individual lenses (such as those of FIG. 11) can be formed upon the transparent heat spreader 1202.

One or more lenses can be formed integrally with the transparent heat spreaders of FIGS. 10-12. Alternatively, one or more lenses can be formed separately from the transparent heat spreaders of FIGS. 10-12 and then attached thereto.

Figure 13:
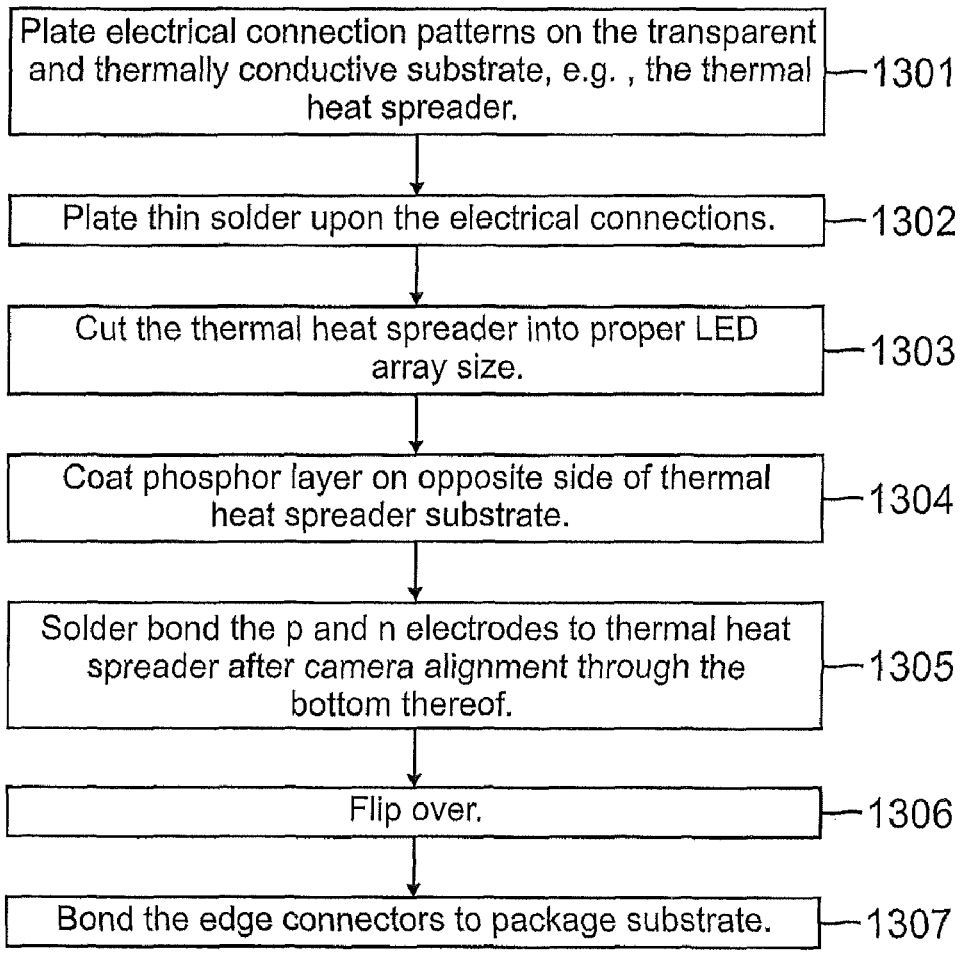
FIG. 13 is a flow chart of fabrication of an LED assembly such as that of FIGS. 3-13, according to an example of an embodiment.

Referring now to FIG. 13, a flow chart shows an example of a procedure for making an LED assembly according to an embodiment. Electrical connection patterns (such as 302 of FIGS. 5 and 6) can plated onto a transparent and thermal conductive substrate, e.g., a transparent heat spreader, as indicated in block 1301. A thin solder layer (such as 303 of FIGS. 5 and 6) can be plated to the connections patterns of the transparent heat spreader, as indicated in block 1302. The solder layer can comprise a 2 micron thick mixture of gold and tin (AuSn), for example.

The transparent heat spreader can be into the desired size to define an LED array (such as that shown in FIG. 5), as indicated in block 1303. A phosphor layer (such as 401 of FIG. 4) can be formed on the opposite side (with respect to the electrical connection patterns) of the transparent heat spreader, as indicated in block 1304. Alternatively, the phosphor layer can be formed upon the transparent heat spreader after attachment of the LED dice thereto.

The p and n electrodes of the LED dice can be solder bonded to the substrate, as indicated in block 1305. Camera alignment through the bottom of the transparent spreader can be used to position the LED dice prior to soldering.

The transparent heat spreader can be flipped over (as shown in FIG. 7), as indicated in block 1306. The edge connectors can be bonded to a package substrate (such as a substrate comprised of aluminum (Al), copper (Cu), aluminum-silicon carbide (AlSiC), aluminum nitride (AlN)—such as substrate 701 of FIG. 7, for example), as indicated in block 1307. The package substrate can have copper (Cu) traces, dielectric, and solder formed thereon.

The use of such a heat spreader can substantially reduce the temperature of the junction, e.g., active area, of the LED dice. Reducing the temperature of the junction of the LED dice allows the LED dice to use more current, produce more light, and/or operate more efficiently.

Thus, one or more embodiments mitigate the temperature of the junction of an LED. Reducing the temperature of an LED increases the efficiency thereof. The use of higher current is thus facilitated. The use of higher current facilitates the production of brighter LEDs that are better suited for use in applications such as flashlights, displays, and generally illumination.

The use of such a heat spreader as that defined by lens 204 and/or standoff 207 can substantially reduce the temperature of the phosphors. Reducing the temperature of the junction of the phosphors allows the phosphors to operate more efficiently. Thus, more of the light emitted by the LED dice 202 can be converted into the desired color or colors.

Thus, one or more embodiments mitigate the temperature of any phosphors that are used to modify the color of an LED. By keeping the phosphors at a lower temperature, better efficiency of the phosphors is maintained. In this manner, the desired color of light from the LED is more reliably provided.

According to one or more embodiments, the temperature of the LED junction and the temperature of the phosphors are mitigated by providing a heat path away from an LED die. This heat path can be though a transparent heat spreader that is attached to both the LED die and a substrate. Thus, heat from the LED can flow through the transparent heat spreader to the substrate.

Other heat paths can be provided. For example, heat can also move directly from the LED die to the substrate. Indeed, any air pockets or voids can be filled with a heat conductive material so as to provide additional or better heat paths between the LED die and the substrate.

As used herein, the term "active region" can be defined to include a region in a light-emitting diode where injected electrons and holes recombine to generate photons in the LED when current is applied.

As used herein "formed upon" can be defined to include deposited, etched, attached, or otherwise prepared or fabricated upon when referring to the forming the various layers.

As used herein "on" and "upon" can be defined to include positioned directly or indirectly on or above.

As used herein, the term "package" can be defined to include an assembly of elements that houses one or more LED chips and provides an interface between the LED chip(s) and a power source to the LED chip(s). A package can also provide optical elements for the purpose of directing light generated by the LED chip. Examples of optical elements are lens and reflectors.

As used herein, the term "transparent" can be defined to include the characterization that no significant obstruction or absorption of electromagnetic radiation occurs at the particular wavelength or wavelengths of interest.

As used herein, the term "transparent heat spreader" can be defined to include a structure through which light from an LED die can be transmitted and which can facilitate the flow of heat produced by an LED die away from the LED die. A transparent heat spreader can be a substrate.

Embodiments described above illustrate, but do not limit, the invention. It should also be understood that numerous modifications and variations are possible in accordance with the principles of the present invention. Accordingly, the scope of the invention is defined only by the following claims.

The invention claimed is:

1. A method for cooling an LED, the method comprising:
    disposing at least one LED die upon a substrate;
    attaching a thermally conductive and optically transparent member to the substrate such that
        the at least one LED die is disposed therebetween and the light emitting surface of the least one LED die faces the thermally conductive and optically transparent member, and
        a thermally conductive path among the at least one LED die, the substrate, and the thermally conductive and optically transparent member is created.

2. The method as claimed in claim 1, wherein the attaching a thermally conductive and optically transparent member to the substrate comprises:
    attaching the thermally conductive and optically transparent member to the substrate via thermally conductive standoff.

3. A method for making an LED, the method comprising:
    plating electrical connection patterns upon a thermally conductive and optically transparent member;
    plating solder upon the electrical connection patterns;
    solder bonding electrodes of an LED die to the thermally conductive and optically transparent member via the plated solder; and
    attaching the thermally conductive and optically transparent member to a substrate such that the LED is disposed therebetween.

4. The method as recited in claim 3, further comprising forming a phosphor layer upon the thermally conductive and optically transparent conductive member.

5. The method as recited in claim 3, wherein the thermally conductive and optically transparent member defines a lens through which light from the LED die passes.

* * * * *